US007012944B2

(12) United States Patent
Lee et al.

(10) Patent No.: US 7,012,944 B2
(45) Date of Patent: Mar. 14, 2006

(54) STRUCTURE AND MANUFACTURING METHOD FOR SINGLE-WAVELENGTH AND MULTI-WAVELENGTH DISTRIBUTED FEEDBACK LASERS

(75) Inventors: San-Liang Lee, Taipei (TW); Ing-Fa Jang, Luodong Township, Yilan County (TW)

(73) Assignee: National Taiwan University of Science and Technology, Taipei (TW)

( * ) Notice: Subject to any disclaimer, the term of this patent is extended or adjusted under 35 U.S.C. 154(b) by 171 days.

(21) Appl. No.: 10/636,103

(22) Filed: Aug. 7, 2003

(65) Prior Publication Data

US 2005/0031009 A1 Feb. 10, 2005

(51) Int. Cl.
*H01S 3/19* (2006.01)
*H01S 3/08* (2006.01)

(52) U.S. Cl. .......................................... 372/50; 372/96

(58) Field of Classification Search ................... 372/50

See application file for complete search history.

(56) References Cited

U.S. PATENT DOCUMENTS

| 5,536,085 | A | * | 7/1996 | Li et al. ........................ 372/50 |
| 5,878,066 | A | * | 3/1999 | Mizutani et al. ............... 372/27 |
| 6,208,793 | B1 | * | 3/2001 | Hillmer et al. ............. 385/131 |
| 6,638,773 | B1 | * | 10/2003 | Hwang et al. .................. 438/2 |
| 6,728,290 | B1 | * | 4/2004 | Coleman et al. ............ 372/102 |

* cited by examiner

*Primary Examiner*—James Vannucci
(74) *Attorney, Agent, or Firm*—Sutherland Asbill & Brennan LLP

(57) ABSTRACT

A single-wavelength distributed feedback (DFB) laser structure is provided. The laser structure having two sections includes an active-material layer for generating a laser having a wavelength in a specific range, two cladding layers respectively covering an upper and a bottom sides of the active-material layer for forming a waveguide structure, a phase shift layer having a specific thickness for controlling a difference between Bragg wavelengths of the two sections, a wet-etching stop layer positioned between the active-material layer and the phase shift layer, and a grating layer having a specific period for determining an illuminating wavelength, wherein a difference between the two sections is an existence of the phase shift layer thereon, and the existence of the phase shift layer causes a difference of the effective refractive indices between the two sections so as to generate a fixed difference between Bragg wavelengths of the two sections.

41 Claims, 11 Drawing Sheets

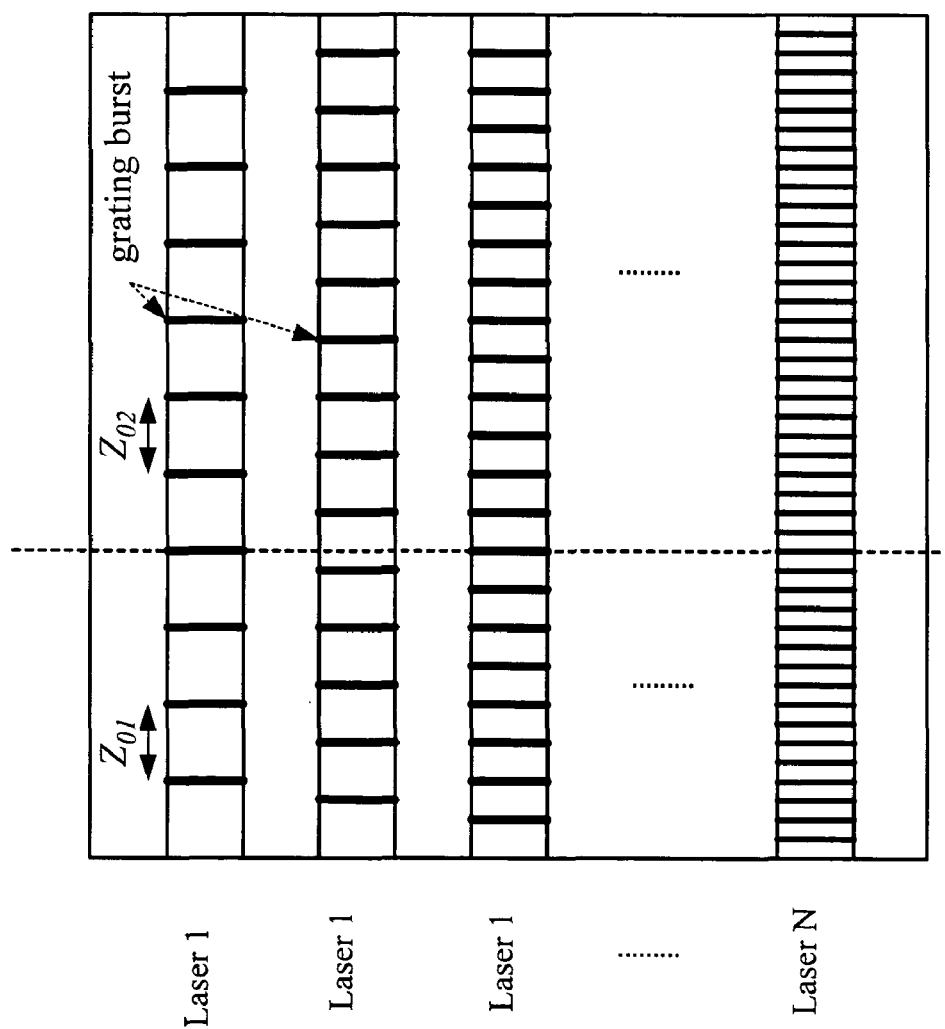

STRUCTURE AND MANUFACTURING METHOD FOR SINGLE-WAVELENGTH AND MULTI-WAVELENGTH DISTRIBUTED FEEDBACK LASERS

FIELD OF THE INVENTION

This invention relates to a laser structure and manufacturing method thereof, and more particularly to a structure and a manufacturing method of single-wavelength distributed feedback lasers and multi-wavelength laser arrays.

BACKGROUND OF THE INVENTION

In WDM (Wavelength Division Multiplexing) networks, fabricating light sources of pure spectral content and multiplexers which are high-performance and low cost are essential for developing the fiber networks. When applying in the WDM network, the distributed feedback (DFB) lasers are the most popular single-wavelength lasers. In a DFB laser, some types of gratings have to be formed on the longitudinal structure thereof for forming a wavelength selection so as to fabricate the single-wavelength laser. This kind of laser has excellent stability and reliability and has been extensively applied in high-performance fiber transmission systems.

Generally, this kind of laser is requested to have a high SMSR (Side-Mode Suppression ratio). However, to be limited by the specific physical characteristic itself, measures have to be taken for achieving high SMSR. Therefore, the yield of fabricating single-wavelength DFB lasers is generally low and this increases the cost. Thus, if we want to employ this kind of lasers in a low price fiber system (such as Metro or Access network), this problem has to be solved firstly.

Currently, the manufacturing method of DFB lasers usually adopts an index-coupled structure, and two end-facets of the laser are respectively coated by an anti-reflection coating and a high-reflection coating for destroying the mode symmetry thereof so as to illuminate a single-wavelength light. However, the phases of the end-facets can significantly influence the output characteristic of the laser so that the position of the lasing wavelength cannot be controlled easily and the yield is low.

Although a utilization of loss-coupled and gratings can solve the yield problem of the single-wavelength laser described above, the shape of the grating has to be precisely controlled, otherwise, will cause a high threshold current. Another method also for solving the problem described above is the utilization of gain-coupled gratings. However, it needs to etch into the gain material, or a complicated epitaxy technique must be employed, so the reliability has to be concerned.

Thus, the present invention intends to solve the drawbacks in the prior arts described above so as to provide low price and high-performance single-wavelength lasers in WDM network.

As to a multi-wavelength laser array in the prior arts, the manufacturing methods therefor include:

(1) Altering the grating period of each laser through multiple holographic exposures;

(2) Altering the effective period of the grating through positioning the waveguide of each laser and the grating at a different angle;

(3) Forming the grating of each laser through electron-beam lithography so as to have different periods;

(4) Altering the effective refractive index of each waveguide through the selective area growth expitaxial growth;

(5) Altering the thickness of each waveguide through multi-etching technique so as to have different effective refractive index; and (6) Altering the width of each waveguide on the mask so as to have different effective refractive index.

In method (1), it has to employ a specific holographic exposure and also will consume more time. Moreover, the performance of each laser in the laser array made from method (2) will be uneven from one to another, and the wavelength range that can be altered by method (2) is also limited. As to method (3), it will take a lot of time to fabricate the laser array so that it is not suitable for mass production. Furthermore, through method (4), it will not easy to fabricate a laser array having even wavelength intervals and accurate wavelength. Then, if the laser array is fabricated by method (5) or (6), the quality thereof will be easily influenced by the fabricating processes, and thus, the wavelength can not be easily controlled and the wavelength range that can be altered is also limited.

In addition, another conventional method of fabricating the multi-wavelength laser array is to employ a sampled grating DBR laser structure. However, it requires a longer length although it is easier than the methods described above and can provide an accurate wavelengths.

Consequently, because of the technical drawbacks described above, the applicant keeps on carving unflaggingly to develop a "structure and manufacturing method of single-wavelength and multi-wavelength distributed feedback lasers" through wholehearted experience and research.

SUMMARY OF THE INVENTION

It is an object of the present invention to provide a single-wavelength laser and a multi-wavelength laser array both having a high performance in the WDM network. It can overcome the fabricating difficulty in accurate wavelength control in the prior art.

It is another object of the present invention to provide manufacturing methods of a single-wavelength laser and a multi-wavelength laser array whose processes are significantly simplified.

It is further object of the present invention to provide a single-wavelength laser whose yield is significantly improved, which has a high output power and which can have anti-reflection coatings on two-end facets thereof for improving wavelength stability.

It is another further object of the present invention to provide a manufacturing method of a multi-wavelength laser array which combines the advantages of sampling grating and DFB lasers so that the wavelength interval of adjacent lasers and the wavelength of each laser can be easily and excellently arranged.

It is additional another object of the present invention to provide a laser source which can reduce the price of a WDM module and increase the reliability thereof so as to increase the application and development of the WDM networks in the future information highway.

According to an aspect of the present invention, a single-wavelength distributed feedback (DFB) laser structure having two sections includes an active-material layer for generating a laser light having a wavelength in a specific range, two cladding layers respectively covering an upper and a bottom sides of the active-material layer for forming a waveguide structure, a phase shift layer having a specific thickness for controlling a difference between Bragg wavelengths of the two sections, a wet-etching stop layer positioned between the active-material layer and the phase shift layer, and a grating layer having a specific period for determining an illuminating wavelength, wherein a difference between the two sections is an existence of the phase shift layer thereon, and the existence of the phase shift layer causes a difference of the effective refractive indices between the two sections so as to generate a fixed difference between Bragg wavelengths of the two sections.

Preferably, the laser is fabricated on a same wafer.

Preferably, the active-material layer and the two cladding layers are formed through a single expitaxial growth step.

Preferably, the active-material is a multiple quantum well (MQW) layer.

Preferably, the two cladding layers are separate confinement heterostructure layers.

Preferably, the grating layer is formed on the laser by cooperating a single holographic exposure with a dry etching or a wet etching.

Preferably, before the grating layer is formed by the holographic exposure, a portion of the phase shift layer on one of the two sections is removed by the wet etching.

Preferably, the section having the phase shift layer thereon is named as a thick section, and the section without the phase shift layer being positioned thereon is named as a thin section.

Preferably, the thick section and the thin section with different or identical lengths can be used in the laser structure.

Preferably, the two sections have different longitudinal lengths for forming a structural asymmetry, and when the length difference is getting larger, the asymmetry is getting larger.

Preferably, the laser structure has anti-reflection coatings on two end-facets thereof for avoiding a mode stability being influenced by facet reflection.

Preferably, the wet-etching stop layer and the grating layer cooperate with each other for controlling a coupling coefficient of the grating layer.

Preferably, the grating layer is located below the active-material layer so that the phase shift layer is located between the grating layer and the active-material layer, and a portion of the phase shift layer located on one of the two sections is removed before growing the active-material layer.

Preferably, the grating layer is located above the active-material layer so that the phase shift layer is located above the grating layer.

Preferably, the laser structure has coatings on two end-facets thereof for providing a proper reflection so as to alter the performance thereof.

Preferably, the laser structure further includes two electrodes applied on the two sections for altering a phase relationship between the two sections so as to stabilize an output mode of the laser structure through adjusting the current on the two electrodes.

Preferably, the laser structure further includes two electrodes applied on the two sections for altering an output wavelength of the laser structure so as to form tunable laser through adjusting the current of the two electrodes.

In accordance with another aspect of the present invention, a single-wavelength distributed feedback (DFB) laser structure having two sections includes an active-material layer for generating a laser light having a wavelength in a specific range, two cladding layers respectively covering an upper and a bottom sides of the active-material layer for forming a waveguide structure, a sampled grating layer having a specific period for determining the lasing wavelength, wherein a difference between the two sections is the duty cycle of the sampled gratings, and a different duty cycle causes a different effective refractive index for the two sections so as to generate a fixed difference between the Bragg wavelengths of the two sections.

Preferably, the laser is fabricated on a same wafer.

Preferably, the active-material layer and the two cladding layers are formed through a single expitaxial growth step.

Preferably, the active-material is a multiple quantum well (MQW) layer.

Preferably, the two cladding layers are separate confinement heterostructure layers.

Preferably, the sampled grating layer is formed on the laser by cooperating a single holographic exposure with a dry etching or a wet etching.

Preferably, the laser structure further includes a wet-etching stop layer to cooperate with the sampled grating layer for controlling a coupling coefficient of the sampled grating layer.

Preferably, the we-etching stop layer is positioned between the active-material layer and the sampled grating layer for facilitating the wet etching.

Preferably, the duty cycle of the sampled grating layer is a proportion occupied by a grating in a sampling period.

Preferably, the different duty cycle for the two sections changes the effective distributed feedback value thereof and cooperates with specific lengths of the two sections for causing different refractive indices of the two sections so as to have an identical effect to a structural asymmetry.

Preferably, when the fixed difference becomes larger, a structural asymmetry becomes bigger so as to facilitate a better mode-selection.

Preferably, the two sections have different sampling periods.

Preferably, the duty cycle of the sampled grating layer on one of the two sections is 100%, which is a continuous grating layer.

Preferably, the laser structure comprises plural sections with different sampling periods combined at a random sequence.

Preferably, the laser structure comprises plural sections with different duty cycles combined at a random sequence.

Preferably, the duty cycle of the sampled grating layer is gradually decreased or increased from one end of the laser structure to the other end thereof.

Preferably, the two sections are made of laser materials which are fabricated through a selective area growth technique for causing a slight difference of the laser materials of the two sections so as to obtain the fixed difference.

Preferably, the two sections are made of laser materials which are altered by a quantum well intermixing after being expitaxied for causing a slight difference of the laser materials of the two sections so as to obtain the fixed difference.

In accordance with further aspect of the present invention, a multi-wavelength distributed feedback (DFB) laser array, wherein each element of the laser array has two sections at a longitudinal structure includes an active-material layer for generating a laser having a wavelength in a specific range, two cladding layers respectively covering an upper and a bottom sides of the active-material layer for forming a waveguide structure, a phase shift layer having a specific thickness for controlling a difference between Bragg wavelengths of the two sections, a wet-etching stop layer positioned between the active-material layer and the phase shift layer, and a sampled grating layer having a specific grating period and a specific sampling period for determining an lasing wavelength, wherein a difference between the two sections is an existence of the phase shift layer thereon, the existence and absence of the phase shift layer causes a difference in the effective refractive indices between the two sections so as to generate a fixed difference between Bragg wavelengths of the two sections, and because the sampling period of the each laser element is different, the peak of reflection spectrum of each laser element is aligned to different positions so as to output different wavelengths.

Preferably, the laser array is fabricated on a same wafer.

Preferably, the active-material layer and the two cladding layers are formed through a single expitaxial growth step.

Preferably, the sampled grating layer is formed on the laser by cooperating a single holographic exposure with a dry etching or a wet etching.

Preferably, the sampled grating layer has a reflection spectrum with plural equidistant peaks whose center peak is aligned to Bragg wavelength and the two sections have different the sampling periods so as to obtain a reflection peak difference $\Delta P$.

Preferably, the specific thickness of the phase shift layer is properly formed so that the fixed difference of Bragg wavelengths of the two sections is approximately equal to the $\Delta P$ plus a fixed wavelength difference so as to cause the reflection spectra of the two sections to be approximately aligned at the first peak thereof, a length ratio of the two sections is adjusted so that the each laser element illuminates in an aligned reflection spectrum at a long wavelength mode or a short wavelength mode for forming a single-wavelength output, and then the sampling period of the each laser element in the laser array is formed to be different from one another for aligning the reflection spectrum of the each laser to different locations so that the each laser element outputs different wavelengths.

Preferably, the fixed difference of Bragg wavelengths of the two sections in a portion of the laser array is equal to or larger than two times of the $\Delta P$, and a length ratio of the two sections is adjusted so that the each laser element illuminates in an aligned reflection spectrum at a long wavelength mode or a short wavelength mode.

Preferably, the grating of the each laser element is one of a loss coupled grating, a gain coupled grating, and a complex-coupled grating for generating a single-wavelength output, the specific thickness of the shift layer is formed so that the fixed difference of Bragg wavelengths of the two sections is approximately equal to the $\Delta P$ plus a fixed wavelength difference so as to cause the reflection spectra of the two sections to be approximately aligned at the first peak thereof, and the two sections have an identical length thereof.

In accordance with further another aspect of the present invention, a method for manufacturing a distributed feedback laser having two sections, the method includes steps of additionally growing a phase shift layer when the laser is firstly processed by a basic structural epitaxy and removing a portion of the phase shift layer which is above one of the two sections through a wet etching before a holographic exposure is processed for forming a grating, wherein a wet-etching stop layer is formed between the laser and the phase shift layer for facilitating the wet-etching.

The above objects and advantages of the present invention will become more readily apparent to those ordinarily skilled in the art after reviewing the following detailed descriptions and accompanying drawings, in which:

BRIEF DESCRIPTION OF THE DRAWINGS

FIG. 7 is a schematic view showing the SGDFB laser array in FIG. 5;

DETAILED DESCRIPTION OF THE PREFERRED EMBODIMENT

Figures 1A, 1B:
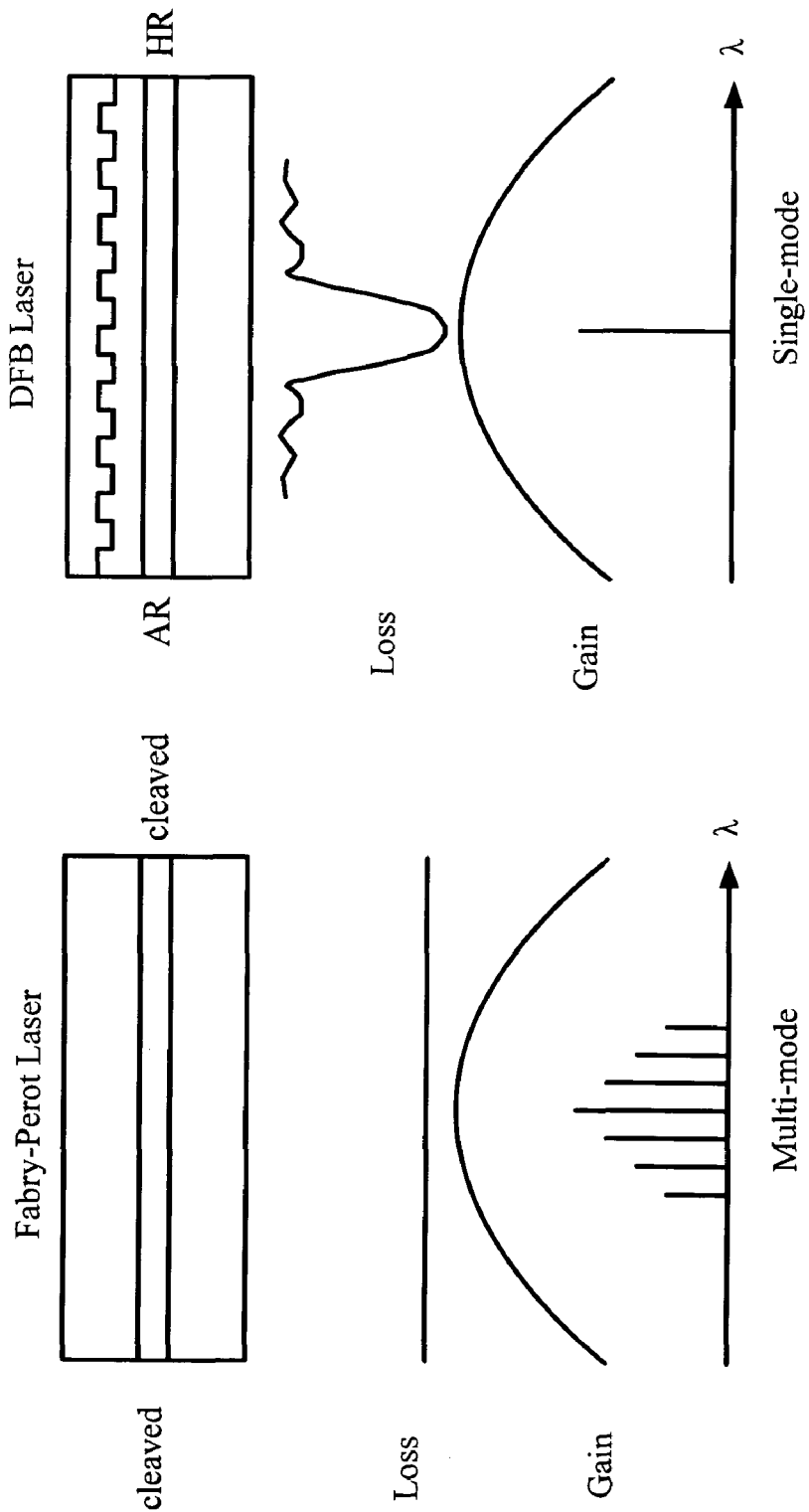
FIG. 1A is a schematic view showing the gain, the loss and the wavelength of the DFB laser.
FIG. 1B is a schematic view showing the gain, the loss and the wavelength of the DFB laser.

In DFB lasers, some type of gratings should be formed on the longitudinal structure thereof for forming a selection of the wavelength so as to fabricate the single-wavelength laser, as shown in FIG. 1A~1B. This kind of lasers has excellent stability and reliability and has been extensively applied in high performance fiber transmission systems. Mostly, the DFB laser utilizes a periodic variation of the grating to form an index-coupled structure. However, because of the symmetry of the whole structure, the laser will respectively has a resonance mode at the two sides of Bragg wavelength, and further, because of the phase relationship between the grating and the facets of the laser, the output characteristic of the laser is significantly influenced by the position of the cleaved facet. Therefore, it will cost a lot to screen the laser. For minimizing this influence, a $\lambda/4$ phase shift grating is employed to cooperate with anti-reflection coatings on two-end facets of the laser so that the laser will illuminate at the middle of the stop-band, namely the Bragg wavelength. But, the disadvantage of this method is that the apparatus for fabricating the phase shift grating is very expensive, and the completed laser may be influenced by SHB (Spatial Hole Burning) effect so the SMSR and the output power will be reduced.

Figures 2A, 2B:
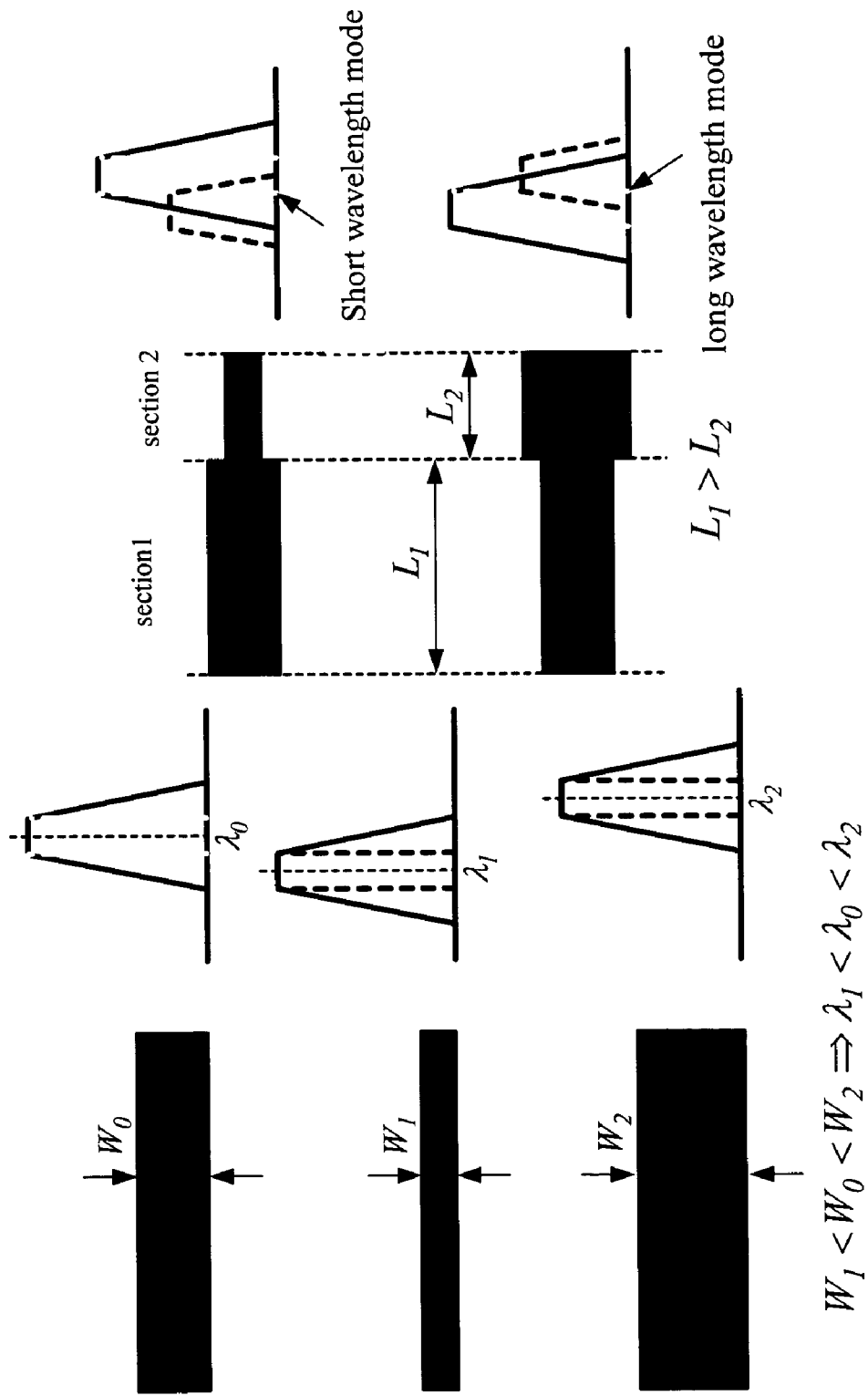
FIG. 2A shows the influence to $\lambda_B$ when altering the waveguide width in the DFB laser proposed by J. Hong et al.
FIG. 2B shows the influence to $\lambda_B$ when altering the waveguide width in the DFB laser proposed by J. Hong et al., wherein the black line and the dotted line are respectively represent the reflection spectrums of section 1 and section 2.

For destroying the mode symmetry of index-coupled DFB laser, J Hong et al. proposed a new DFB laser structure that can exactly control the wavelength. Because Bragg wavelength ($\lambda_B$) is decided by the grating period ($\Lambda$) and the effective refractive index ($\bar{n}_{eff}$) of the whole structure, which is further decided by the composition and framework of the laser, when the width of the waveguide is altered, $\bar{n}_{eff}$ will accordingly be altered and $\lambda_B$ and the position of corresponding stop-band will also moved, as shown in FIG. 2A. Therefore, this new laser includes two sections having different ridge waveguide widths, which have different $\lambda_B$ and the positions of corresponding stop-bands, and thus the two stop-bands will overlap with each other in a specific wavelength range. Furthermore, if the lengths of the two sections are unequal, the whole laser will be led by the grating on the longer section so that the grating on the shorter section will cause a perturbation effect to the symmetrical modes at the two sides of the stop-bands so as to destroy the symmetry thereof. As a result, only one mode will illuminate and the other one will be restrained. For example, when the length of section 1 is larger than that of section 2, the laser will be led by section 1, and if the waveguide width of section 1 is larger than that of section 2, the stop-bands of two sections will overlap at the position of short wavelength mode in section 1. Thus, it will result in an illumination at the short wavelength mode, and on the contrary, the illumination will occur at the long wavelength mode, as shown in FIG. 2B.

Figure 3:
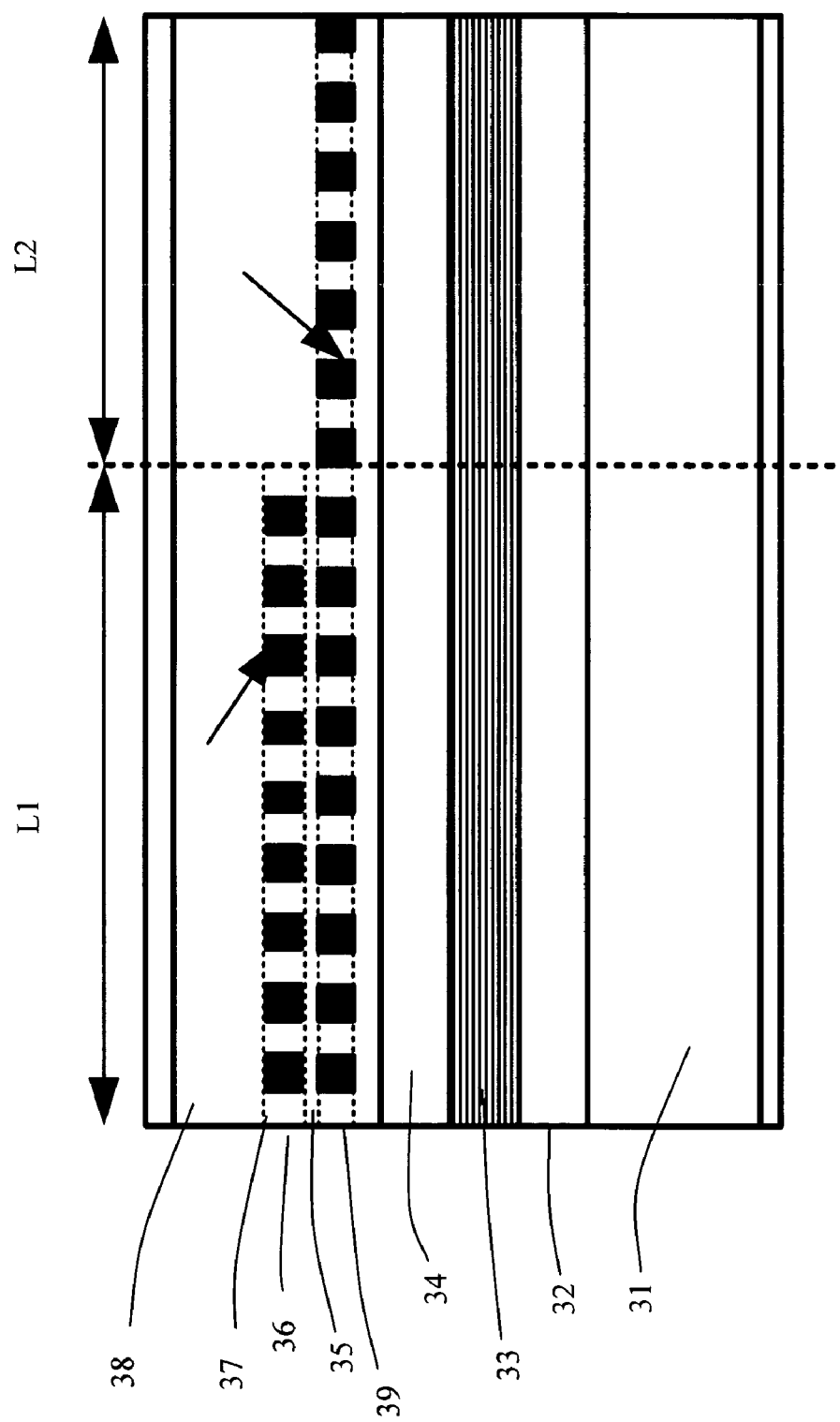
FIG. 3 is a schematic view showing a framework of a DFB laser in a preferred embodiment according to the present invention.

Now, the present invention proposes a novel DFB laser structure which is different from that proposed by J. Hong et al. Please refer to FIG. 3 which illustrates a DFB laser structure in a preferred embodiment according to the present invention. The laser structure includes a N-type cladding layer 31, two SCHs (Separate Confinement Heterostructures) 32 and 34, a MQW (Multiple Quantum Well) 33, a grating layer 35, two wet-etching stop layers 36 and 39, a phase shift layer 37 and a P-type cladding layer 38. In the laser structure according to the present invention, the laser structure includes two sections, wherein each laser is formed on a same wafer and the structures of the laser waveguide are formed through a single expitaxial growth step. The difference between the structures of two sections is an existence of the phase shift layer 37 thereon, and the existence of the phase shift layer 37 causes different $\lambda_B$ between the two sections. And, the phase shift layer is formed additionally when the DFB laser is firstly proceeded by a basic structural epitaxy, and the wet-etching stop layer 36 is formed therebetween. Then, a portion of the phase shift layer 37 on one of the two sections is removed through a wet etching before the grating layer 35 is formed through the holographic exposure so that the section having the phase shift layer thereon is named as a thick section, and the section without the phase shift layer being positioned thereon is named as a thin section. The existence of the phase shift layer causes a difference of the effective refractive indices between the two sections so as to generate a fixed difference ($\Delta\lambda_B$) between Bragg wavelengths of the two sections. Furthermore, the two sections must have different longitudinal lengths for forming a structural asymmetry, and therefore a bigger $\Delta\lambda_B$ can cause a larger asymmetry so as to facilitate a mode selection. Thus, it only needs to properly adjust $\lambda_B$ caused by the phase shift layer 37 and also a length ratio of the two sections, and then the laser can exactly illuminate at a long wavelength mode or a short wavelength mode around the Bragg wavelength. Besides, the grating layer 35 can be directly formed on the phase shift layer 37 and the SCH layer instead.

For describing the features of the laser according to the present invention, the following embodiments are employed to explain the theory thereof.

Figure 4:
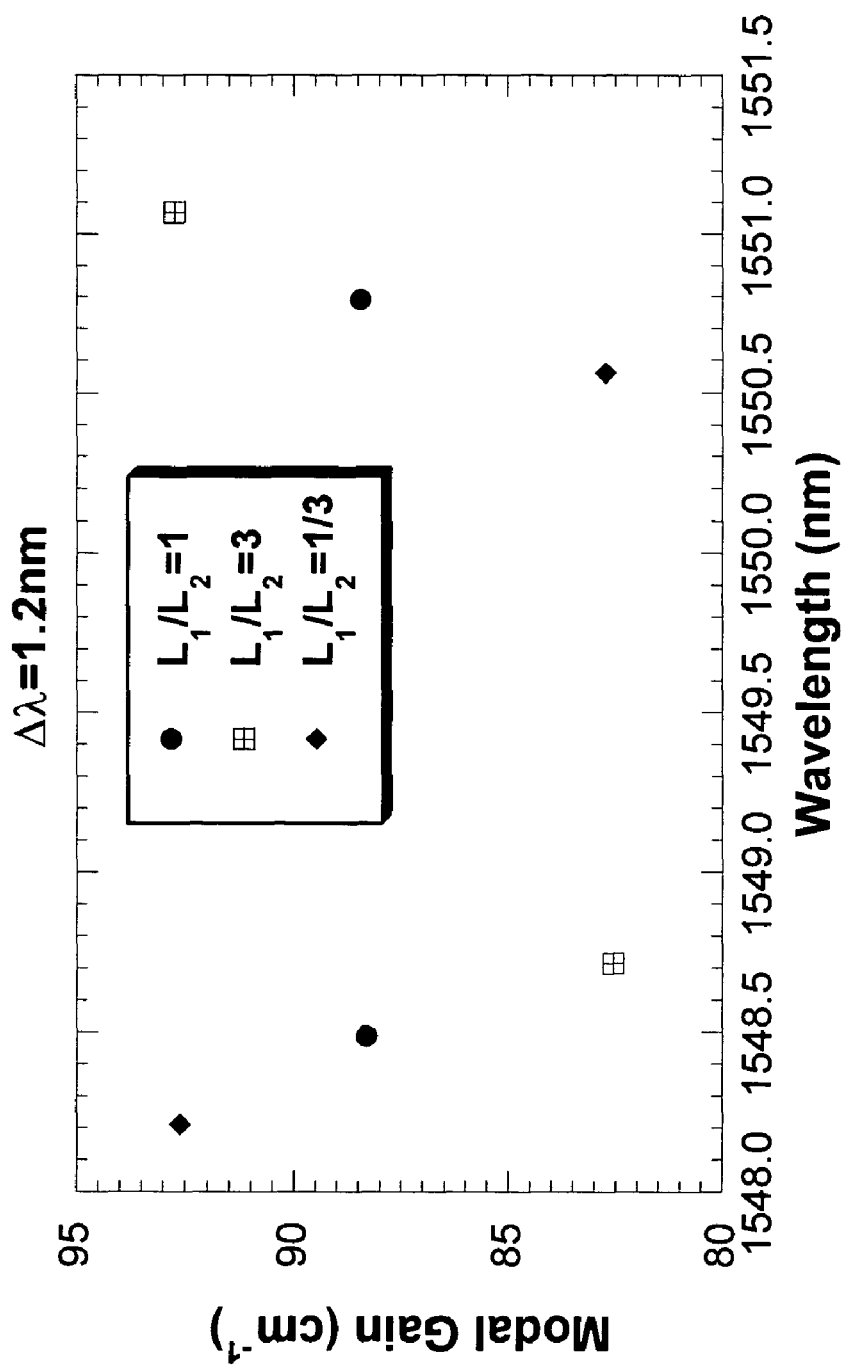
FIG. 4 shows a simulation result of the DFB laser in FIG. 3.

Please refer to FIG. 4 which illustrate a simulation result of the laser according to the present invention. In this simulation, it supposes that the phase shift layer on section 2 is removed so as to cause a $\lambda_B$ difference between the two sections, which is previously set to be approximately a half of the width of the stop-band, and $\lambda_B$ of section 1 is 1550 nm. Thus, the corresponding grating period ($\Lambda$) is approximately 0.2387 $\mu$m. Moreover, because the grating is formed by a single expitaxial growth step, the grating periods of the two sections will be the same so that the needed thickness of the phase shift layer can be calculated thereby. In addition, it also can assume that the depths of the two sections are identical, and thus the two sections will have identical coupling coefficient $\kappa$. Here, it is supposed to be 50 $cm^{-1}$. Furthermore, the length ratio of the two sections ($L_1/L_2$) is respectively set as 1, 3 and 1/3.

As the result shown in FIG. 4, when the lengths of two sections are identical, the two modes still illuminate simultaneously but the equivalent stop-band slants toward the short wavelength and the threshold gain is increased. When the length ratio of the two sections is 3, the grating on section 1 will be in lead and the laser will therefore illuminate at the short wavelength mode, and on the contrary, when the length ratio of the two sections is 1/3, the grating on section 2 will be in lead and the laser will therefore illuminate at the long wavelength mode. Meanwhile, no matter the laser illuminates at short or long wavelength mode, the threshold gain thereof is reduced. According to the result described above, it can prove that the laser according to the present invention is positive in controlling the illuminating mode of the index-coupled DFB laser.

Consequently, when comparing the laser structure having a phase shift layer thereon according to the present invention with the conventional DFB laser which alters the waveguide widths of different sections, it comes that:

1. The present invention employs a phase shift layer to alter the longitudinal $\bar{n}_{eff}$ distribution in the laser, and therefore, a needed $\Delta\lambda$ can be determined through accurately controlling the composition and the thickness of the phase shift layer in expitaxy growth. But, in the prior art, it is difficult to exactly control the $\Delta\lambda$ through the method of varying the width of ridge.

2. If it needs to have a larger value of $\Delta\lambda$, for the present invention, it just needs to alter the composition and the thickness of the phase shift layer and then the performance of the laser will not be influenced significantly. However, through the method of varying the waveguide in the prior arts, it has to have a huge difference between the ridge width of the two sections, and a large waveguide width will cause an unstable transverse mode. Furthermore, because the loss at the junction of the two sections is bigger, the threshold current will be increased.

In addition, after minor modification, the laser structure according to the present invention allows to fabricate lasers having different wavelengths on a same wafer. Previously, it has mentioned that the SGDBR (Sampled-Grating Distributed Bragg Reflector) laser can be employed to fabricate a multi-wavelength laser array. Now, the same concept also can be merged in the DFB laser according to the present invention to increase the stability, and at the same time, the accuracy of the wavelength spacing can still be maintained in the laser array through the laser structure having the phase shift layer thereon described above.

Figure 5:
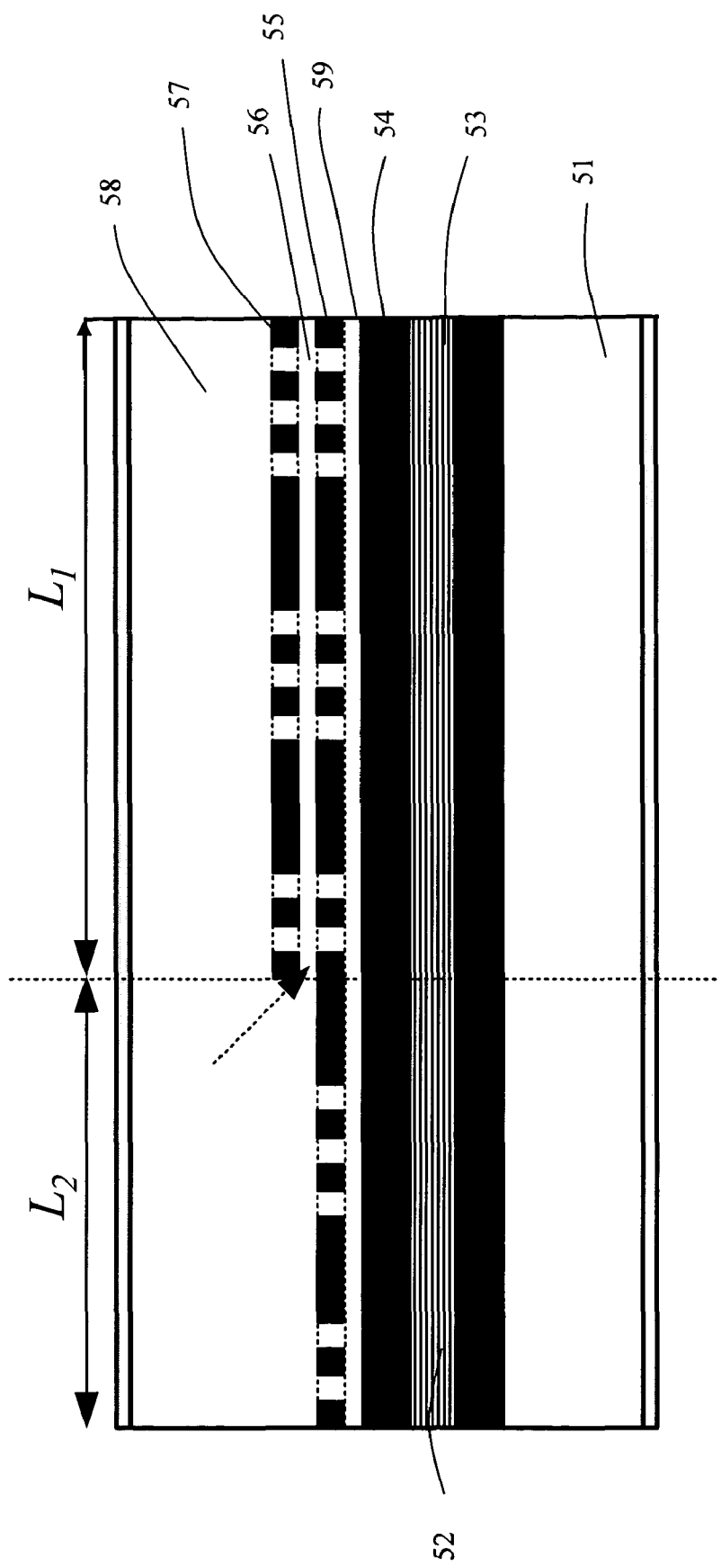
FIG. 5 is a schematic view showing a framework of a SGDFB laser in another preferred embodiment according to the present invention.

Please refer to FIG. 5 which illustrates the SGDFB laser structure in another preferred embodiment according to the present invention. The laser structure includes a N-type cladding layer 51, two SCHs (Separate Confinement Heterostructures) 52 and 54, a MQW (Multiple Quantum Well) 53, a grating layer 55, two wet-etching stop layers 56 and 59, a phase shift layer 57 and a P-type cladding layer 58. The laser structure includes two sections of sampled gratings, and the sampling periods ($Z_0$) of the two sections are different so as to cause a difference $\Delta P$ between the reflection peaks (P) of the two sections. Then, through the technique of phase shift described above, the difference between the Bragg wavelengths of the two sections can be formed to be $\Delta P$ so as to cause the reflection spectrums of the two sections to align at the first-order peak.

Figure 6A:
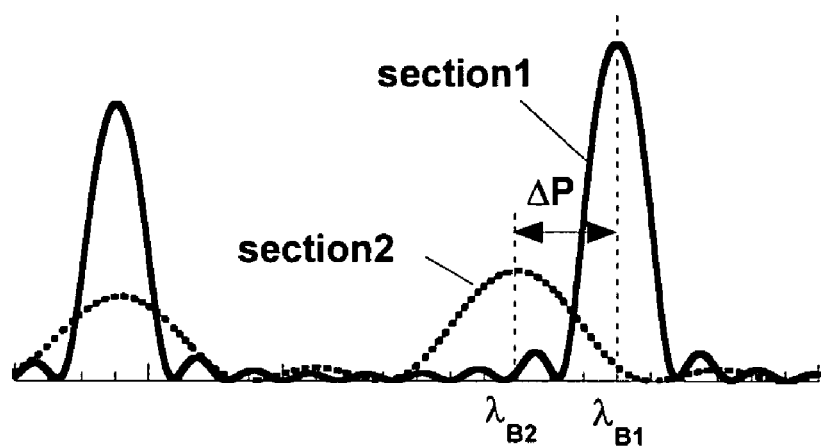
FIGS. 6A~B are schematic views showing the reflection spectrums of the SGDFB laser in FIG. 5.
Figure 6B:
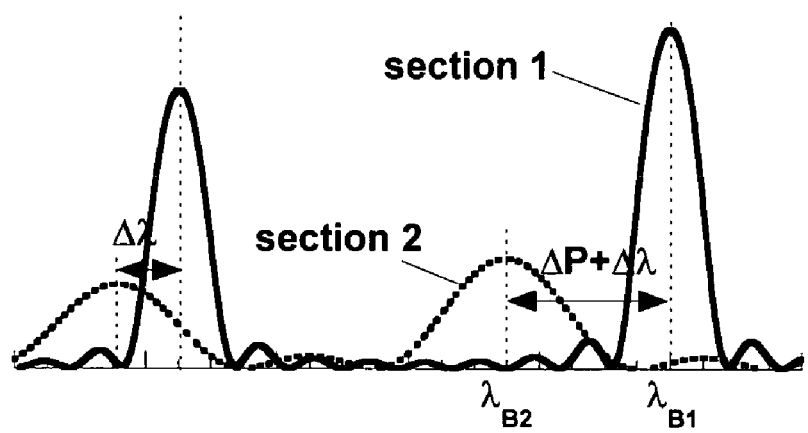

Since the sampling periods ($Z_0$) of the two sections of each laser in a laser array are altered according to the present invention, the reflection spectrum of each laser will align at different positions and therefore each laser will output different wavelengths. Moreover, because the index-coupled DFB laser is employed by the present invention, the laser will respectively have an illumination mode at two sides of the aligning position of the reflection spectrum. For destroying the mode symmetry of the laser, asymmetrical coatings can be coated on the two-end facets of the laser. However, the wavelength selection is influenced by the facet phase, and thus the illuminating wavelengths will statistically distribute at long wavelength or short wavelength mode. Therefore, the variation of the wavelength will not be smaller than the stop-band width and the accuracy of the wavelength interval of the laser array will be reduced. For this reason, the present invention employs the phase shift layer to increase the accuracy of the wavelength interval for the laser array though forming the difference between $\Delta\lambda$ of the two sections to be ($\Delta P+\Delta\lambda$). And then, through adjusting the length ratio ($L_1/L_2$) of the two sections, the reflection spectrum of laser will align at the long wavelength mode or the short wavelength mode. The reflection spectrums are shown in FIGS. 6A~B.

Please refer to FIG. 7 which illustrates a schematic view of the SGDFB laser array in FIG. 5. In this laser array, the laser element is namely the SGDFB laser described above. Moreover, the whole structure includes two sections respectively having different P and, at the same side of the laser array, all the laser elements also have different P. Because the $\lambda_B$ difference between the two sections of each laser element is ($\Delta P+\Delta\lambda$) and the value of $L_1/L_2$ of each laser element is identical, the wavelength thereof will exactly illuminate at long wavelength or short wavelength mode. Furthermore, because the wavelength and the $\lambda_B$ difference ($\Delta\lambda$) of each laser are both identical, the wavelength interval of the laser array can be accurately identical to a desired value.

For describing the laser array according to the present invention, the following embodiment is employed to explain the theory thereof.

Suppose that the total length of the laser array is 600 $\mu$m, and the laser array includes two sections having different P, wherein the identical sampling duty cycle (D) thereof is 0.35 and the identical $\kappa$ is 70 cm$^{-1}$. Moreover, the P in section 1 is $P_1$, the corresponding $Z_0$ is $Z_{01}$ and the length of section 1 is $L_1$. Furthermore, the P in section 2 is $P_2$, the corresponding $Z_0$ is $Z_{02}$ and the length of section 2 is $L_2$. In addition, it also assumes that two facets of the laser are coated by anti-reflection (AR) coatings so as to eliminate the effect of facet reflection. But, because $\lambda_B$ of two sections are different, a corresponding waveguide thickness difference $\Delta d$ will occur and the influence of interface reflection should be considered.

Figure 8A:
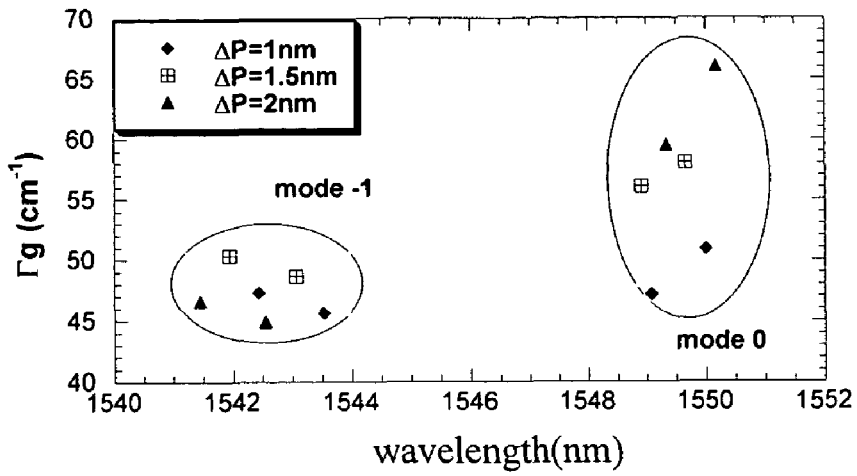
FIG. 8A shows a simulation result of the SGDFB laser when $\lambda_B$ difference is equal to $\Delta P$ and $L_1/L_2=1$.
Figure 8B:
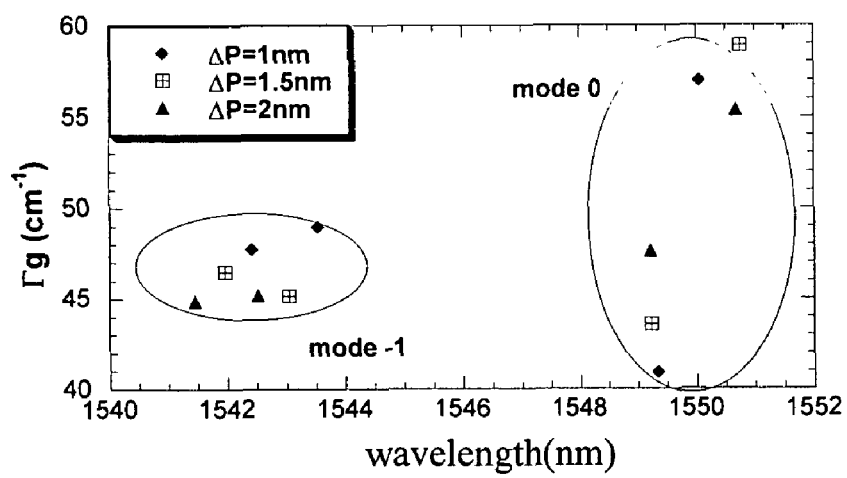
FIG. 8B shows a simulation result of the SGDFB laser when $\lambda_B$ difference is equal to $\Delta P$ and $L_1/L_2=3$.

Firstly, let's consider the situation that the $\lambda_B$ difference between the two sections equals to $\Delta P$. Suppose that section 2 has P=6 nm and section 1 has P=(6+$\Delta P$) nm, wherein $\Delta P$ is respectively 1 nm, 1.5 nm, and 2.4 nm; and the length ratio of the two sections ($L_1/L_2$) is 1 and 3. Please refer to FIGS. 8A~B which illustrate the simulation results of the conditions described above. When $L_1/L_2$ equals to 1, because the reflection spectrums of the two sections are aligned at the first peak, the SGDFB laser should illuminate right here (named as mode-1). Moreover, because the $\lambda_B$ difference between the two sections is $\Delta P$ and then the threshold gain becomes larger at the Bragg wavelength (named as mode-0). When $\Delta P$ is getting larger, the difference between the threshold gains of mode-1 and mode-0 will also become larger. However, because the mode symmetry is still maintained, two sides of mode-1 will respectively exist an lasing mode. Furthermore, when $L_1/L_2$ equals to 3, because the lengths of the two sections are different, the laser will be led by the grating in section 1. Then, further because the difference of reflection spectrum at mode-0 is $\Delta P$ and the grating in section 2 promotes the reflectance of the short wavelength mode, there will exist an illumination there. Till $\Delta P$ is big enough to reduce the reflection spectrum overlapped at mode-0, the laser will just illuminates at the long wavelength and short wavelength of mode-1.

Figure 9:
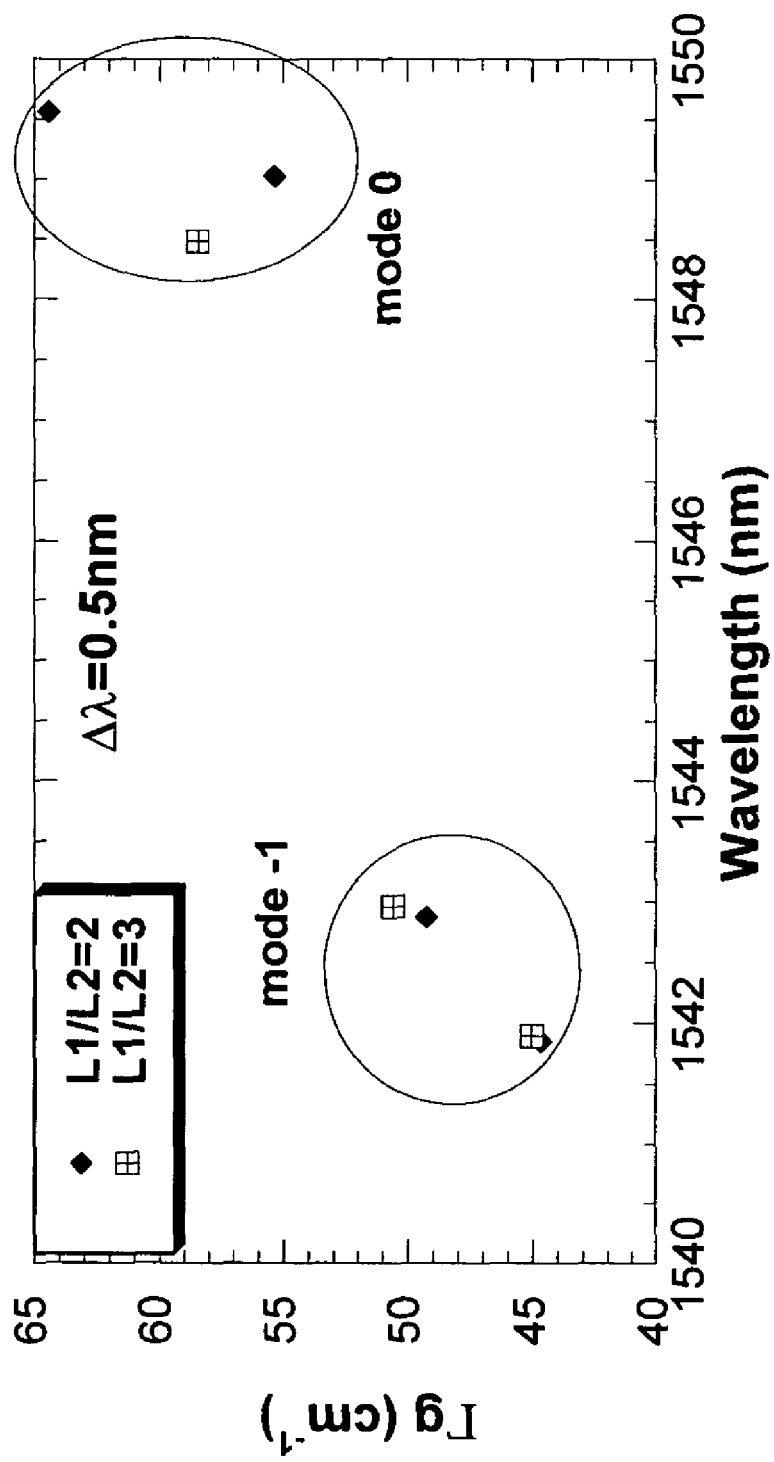
FIG. 9 shows a simulation result of the SGDFB laser when $\lambda_B$ difference is equal to $(\Delta P+\Delta\lambda)$.

Now, $\lambda_B$ difference is increased to ($\Delta P+\Delta\lambda$), and then it supposes that $\Delta P$ equals to 1.5 nm, $\Delta\lambda$ equals to 1 nm, and the length ratio of two sections ($L_1/L_2$) is 2 and 3. Please refer to FIG. 9 which illustrates the simulation result of the conditions described above. Because the overlap of reflection spectrum at mode-0 becomes smaller and the grating in section 1 becomes more beneficial to the short wavelength mode of mode-1, the laser will illuminate at the short wavelength mode of mode-1 and the difference between threshold gains of mode-1 and mode-0 will become larger.

Figure 10A:
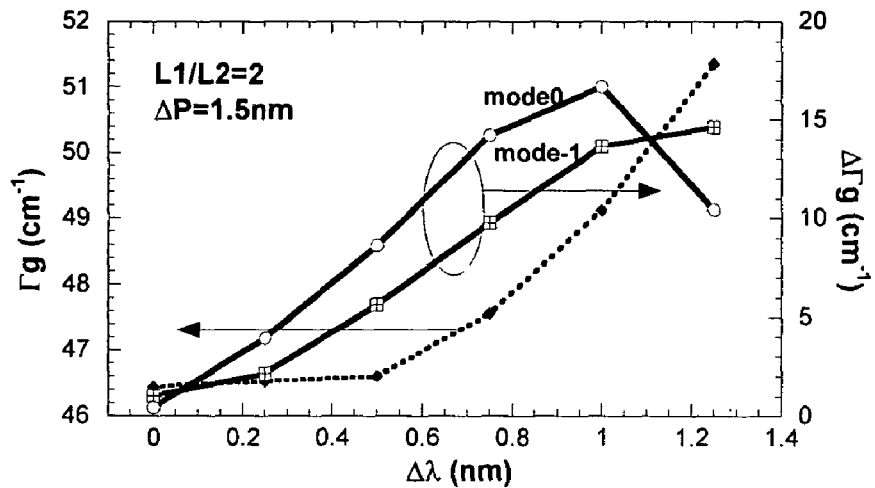
FIG. 10A shows the best values of the SGDFB laser when $\lambda_B$ difference is equal to $(\Delta P+\Delta\lambda)$ and $L_1/L_2=2$.
Figure 10B:
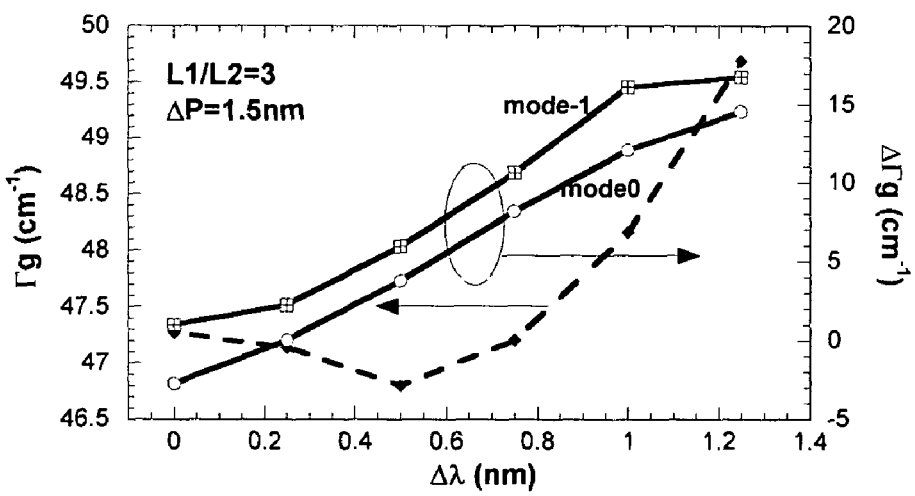
FIG. 10B shows the best value of the SGDFB laser when $\lambda_B$ difference is equal to $(\Delta P+\Delta\lambda)$ and $L_1/L_2=3$.

If other conditions are kept the same and only the value of $\Delta\lambda$ is changed, the simulation results are shown in FIGS. 10A~B. FIGS. 10A~B show the threshold gain of short wavelength mode of mode-1 and compare the threshold modal gain $\Delta\Gamma g$, between short wavelength and long wavelength of mode-1 (marked as mode-1) and the $\Delta\Gamma g$ between short wavelength modes of mode-1 and mode-0 (marked as mode-0).

Please refer to FIG. 10A which illustrates the best values of the SGDFB laser when $\lambda_B$ difference is equal to ($\Delta P+\Delta\lambda$) and $L_1/L_2$=2, and FIG. 10B which illustrates the best values of the SGDFB laser when $\lambda_B$ difference is equal to ($\Delta P+\Delta\lambda$) and $L_1/L_2$=3. As shown in FIGS. 10A~B, when $\Delta\lambda$ is increased and then the $\Delta\Gamma g$ between short wavelength modes at mode-1 and mode-0 are accordingly increased, SGDFB laser will stably illuminate at mode-1. Besides, because the $\Delta\Gamma g$ of short and long wavelength modes at mode-1 are accordingly increased owing to the increase of $\Delta\lambda$, the laser can output the wavelength with high SMSR. However, the price for increasing $\Delta\lambda$ is an increase in threshold gain of the laser. Comparing $L_1/L_2$=2 with 3, because the length of section 2 is too long, the leading of section 1 will be reduced so as to reduce $\Delta\Gamma g$. Therefore, when $L_1/L_2$=3, the $\Delta\Gamma g$ of the short and long wavelength modes at mode-1 will be larger.

Figure 11:
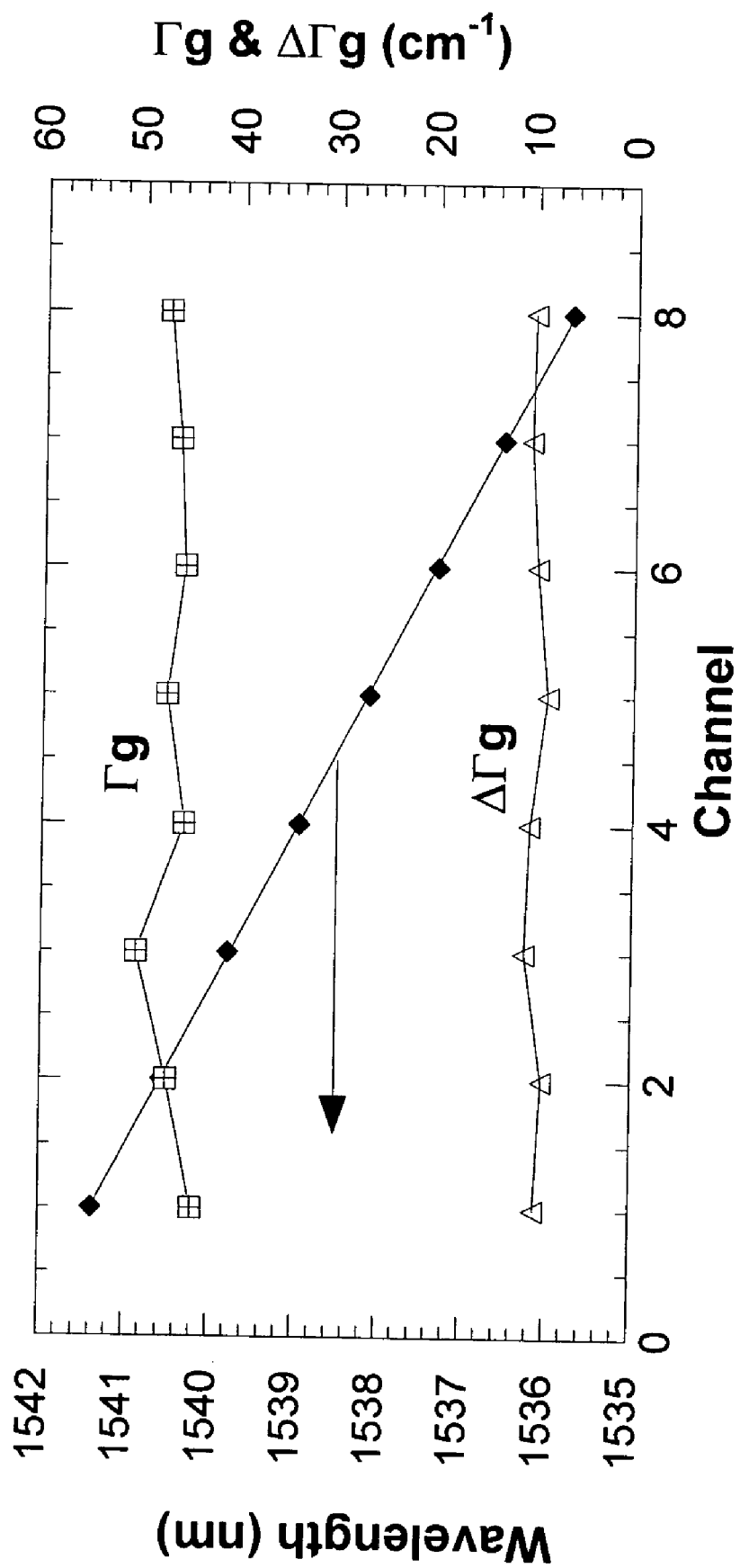
FIG. 11 is a schematic view showing the output wavelength and the mode selection of a SGDFB laser array having eight channels.

Please refer to FIG. 11 which illustrates a schematic view showing the output wavelength, corresponding threshold gain ($\Gamma g$) and the $\Delta\Gamma g$ of short and long wavelength modes at mode-1 in a SCDFB laser array having eight channels.

According to this result, the average wavelength interval of the array is 0.803 nm and the ΔΓgL of each channel is larger than 0.3. Thus, this laser conforms to the request of single mode operation in the DWDM laser.

Consequently, the SGDFB laser according to the present invention owns the advantages as follows:

1. Because the utilization of the sampled grating for the laser, different wavelengths can be generated from a single wafer and the wavelength position can be easily and accurately set.

2. It only needs one single holographic exposure to form the grating and the manufacturing process of the entire laser array is identical to the general standard DFB laser.

3. The illuminating mode of the DFB laser according to the present invention is highly stable and thus the problem of mode-hopping that occurs in DBR laser will not be happened.

4. Through properly adjusting the Δλ difference and $L_1/L_2$ ratio of the two sections, the laser can exactly illuminate at long wavelength or short wavelength mode and the single mode has a great yield. Furthermore, the AR coatings on the two facets can avoid the influence of facet reflection.

5. The entire size of the laser can significantly reduced so as to reduce the volume of the laser array and the cost.

Besides, when comparing with the prior arts, the present invention obviously owns the superiorities as follows:

1. The illuminating wavelength of the laser can be easily controlled by means of altering the waveguide and length ratio of the two sections thereof, and because the manufacturing process has no different from the conventional ones, the process is simple and has a high single-mode yield.

2. Because there is no need to form asymmetry coatings on two facets for destroying the mode symmetry, the two facets can be coated by AR coatings so as to avoid the effect of facet reflection.

3. Because the lengths of the two sections are different, the entire illumination will slant toward the section having longer length, most light will be outputted from the section having shorter length so as to increase the output power, and further, this section is minor influenced by SHB.

4. Through additionally forming the sampled grating, different wavelengths can be generated from a single wafer to form a multi-wavelength laser array.

In addition, the applications for the present invention are as follows:

1. Because it needs a single-wavelength laser which has outstanding performance and is cheap in WDM network, the single-wavelength distributed feedback laser having high performance and low cost provided by the present invention should conform to the needs in WDM network and can be performed well, too.

2. The present invention can simply and exactly control the distributed feedback laser to illuminate at long wavelength or short wavelength mode of Bragg wavelength on through the general manufacturing process, and thus the present invention can be applied to effectively simplify the processing technique and reduce the cost of elements.

3. Through the sampled grating additionally formed thereon, the multi-wavelength laser array can be formed so that the present invention can be the multi-channel light source in DWDM or CWDM (Coarse wavelength Division Multiplxing).

In view of the aforesaid, the present invention can effectively solve the problems and drawbacks in the prior arts and thus the present invention conforms to the demand of the industry and is industrial valuable.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A single-wavelength distributed feedback (DFB) laser structure having two sections, comprising:
   an active-material layer for generating a laser light having a wavelength in a specific range;
   two cladding layers respectively covering an upper and a bottom sides of said active-material layer for forming a waveguide structure;
   a phase shift layer having a specific thickness for controlling a difference between Bragg wavelengths of said two sections;
   a grating layer having a specific period for determining an illuminating wavelength;
   a wet-etching stop layer positioned between said active-material layer and said grating layer, wherein said wet-etching stop layer and said grating layer cooperate with each other for controlling a coupling index of said grating layer; and
   another wet-etching stop layer positioned between said phase shift layer and said grating layer,
   wherein a difference between said two sections is an existence of said phase shift layer thereon, and said existence of said phase shift layer causes a difference of the effective refractive indices between said two sections so as to generate a fixed difference between Bragg wavelengths of said two sections.

2. The laser structure according to claim 1 wherein said laser is fabricated on a same wafer.

3. The laser structure according to claim 1 wherein said active-material layer and said two cladding layers are formed through a single expitaxial growth step.

4. The laser structure according to claim 1 wherein said active-material is a multiple quantum well (MQW) layer.

5. The laser structure according to claim 1 wherein said two cladding layers are separate confinement heterostructure layers.

6. The laser structure according to claim 1 wherein said grating layer is formed on said laser by cooperating a single holographic exposure with a dry etching or a wet etching.

7. The laser structure according to claim 6 wherein before said grating layer is formed by said holographic exposure, a portion of said phase shift layer on one of said two sections is removed by said wet etching.

8. The laser structure according to claim 7 wherein said section having said phase shift layer thereon is named as a thick section, and the section without said phase shift layer being positioned thereon is named as a thin section.

9. The laser structure according to claim 8 wherein said thick section and said thin section with different or identical lengths are combined at an arbitray sequence in said laser structure.

10. The laser structure according to claim 1 wherein said two sections have different longitudinal lengths for forming a structural asymmetry, and when said fixed difference is getting larger, said asymmetry is getting larger.

11. The laser structure according to claim 1 wherein said laser structure has an anti-reflection layer on two end-facets thereof for avoiding a mode stability being influenced by a reflection.

12. The laser structure according to claim 1 wherein said grating layer is located below said active-material layer so that said phase shift layer is located between said grating layer and said active-material layer, and apportion of said phase shift layer located on one of said two sections is removed before growing said active-material layer.

13. The laser structure according to claim 1 wherein said grating layer is located above said active-material layer so that said phase shift layer is located above said grating layer.

14. The laser structure according to claim 1 wherein said laser structure has coatings on two end-facets thereof for providing a proper reflecton so as to alter a performance thereof.

15. The laser structure according to claim 1 wherein said laser structure has asymmetric thin film coatings at two end-facets thereof for further destroying a mode symmetry, and because a mode-selection of said laser structure is influenced and said illuminating wavelength is randomly arranged at long wavelength mode or a low wavelength mode, a variation of said wavelength is approximately equal to a width of the stop-band.

16. The laser structure according to claim 1 further comprising two electrodes applied on said two sections for altering a phase relationship between said two sections so as to stabilize an output mode of said laser structure through adjusting a current of said two electrodes.

17. The laser structure according to claim 1 further comprising two electrodes applied on said two sections for altering an output wavelength of said laser structure so as to form tunable laser through adjusting a current of said two electrodes.

18. A single-wavelength distributed feedback (DFB) laser structure having two sections, comprising:
an active-material layer for generating a laser light having a wavelength in a specific range;
two cladding layers respectively covering an upper and a bottom sides of said active-material layer for forming a waveguide structure;
a sampled grating layer having a specific period for determining a lasing wavelength, and
a wet-etching stop layer cooperating with said sampled grating layer for controlling a coupling index of said sampled grating layer;
wherein a difference between said two sections is a duty cycle of said sampled grating layer, and a different said duty cycle causes a different effective refractive index for said two sections so as to generate a fixed difference between Bragg wavelengths of said two sections.

19. The laser structure according to claim 18 wherein said laser is fabricated on a same wafer.

20. The laser structure according to claim 18 wherein said active-material layer and said two cladding layers are formed through a single expitaxial growth step.

21. The laser structure according to claim 18 wherein said active-material is a multiple quantum well (MQW) layer.

22. The laser structure according to claim 18 wherein said two cladding layers are separate confinement heterostructure layers.

23. The laser structure according to claim 18 wherein said sampled grating layer is formed on said laser by cooperating a single holographic exposure with a dry etching or a wet etching.

24. The laser structure according to claims 23 wherein said wet-etching stop layer is positioned between said active-material layer and said sampled grating layer for facilitating said wet etching.

25. The laser structure according to claim 18 wherein said duty cycle of said sampled grating layer is a proportion occupied by a grating in a sampling period.

26. The laser structure according to claim 18 wherein said different duty cycle for said two sections changes the effective distributed feedback value thereof and cooperates with specific lengths of said two sections for causing different refractance of said two sections so as to have an identical effect to a structural asymmetry.

27. The laser structure according to claim 18 wherein when said fixed difference becomes larger, a structural asymmetry becomes bigger so as to facilitate a mode-selection.

28. The laser structure according to claim 18 wherein said two sections have different sampling periods.

29. The laser structure according to claim 18 wherein said duty cycle of said sampled grating layer on one of said two sections is 100%, which is a continuous grating layer.

30. The laser structure according to claim 18 wherein said laser structure comprises plural sections with different sampling periods combined at an arbitrary sequence.

31. The laser structure according to claim 18 wherein said laser structure comprises plural sections with different duty cycles combined at an arbitrary sequence.

32. The laser structure according to claim 18 wherein said duty cycle of said sampled grating layer is gradually decreased or increased from one end of said laser structure to the other end thereof.

33. The laser structure according to claim 18 wherein said two sections are made of laser materials which are fabricated through a selective area growth technique for causing a slight difference of said laser materials of said two sections so as to obtain said fixed difference.

34. The laser structure according to claim 18 wherein said two sections are made of laser materials which are altered by a quantum well intermixing after an expitaxy of said active material for causing a slight difference of said laser materials of said two sections so as to obtain said fixed difference.

35. A multi-wavelength distributed feedback (DFB) laser array, wherein each element of said laser array has two sections at a longitudinal structure, comprising:
an active-material layer for generating a laser having a wavelength in a specific range;
two cladding layers respectively covering an upper and a bottom sides of said active-material layer for forming a waveguide structure;
a phase shift layer having a specific thickness for controlling a difference between Bragg wavelengths of said two sections;
a sampled grating layer having a specific grating period and a specific sampling period for determining an illuminating wavelength;
a wet-etching stop layer positioned between said active-material layer and said sampled grating layer; and
another wet-etching stop layer positioned between said phase shift layer and said sampled grating layer,
wherein a difference between said two sections is an existence of said phase shift layer thereon, said existence of said phase shift layer causes a difference of the effective refractive indices between said two sections so as to generate a fixed difference between Bragg wavelengths of said two sections, and because said sampling period of said each laser element is different, the peak of reflection spectrum of each laser element is aligned to different positions so as to output different wavelengths, and said fixed difference between Bragg wavelengths of said two sections of a laser element in said laser array is for controlling said laser element to emit light at an aligned reflection peak, wherein a length ratio of said two sections is adjusted so that said each laser element illuminates at a long wavelength mode or a short wavelength mode of said reflection peak.

36. The laser array according to claim 35 wherein said laser array is fabricated on a same wafer.

37. The laser array according to claim 35 wherein said active-material layer and said two cladding layers are formed through a single expitaxial growth step.

38. The laser array according to claim 35 wherein said sampled grating layer is formed on said laser by cooperating a single holographic exposure with a dry etching or a wet etching.

39. The laser array according to claim 37, wherein said sampled grating layer has a reflection spectrum with plural equidistant peaks whose center peak is aligned to Bragg wavelength and said two sections have different said sampling periods so as to obtain a reflection peak difference $\Delta P$.

40. The laser array according to claim 39, wherein said specific thickness of said phase shift layer is properly formed so that said fixed difference of Bragg wavelengths of said two sections is approximately equal to said $\Delta P$ plus a fixed wavelength so as to cause said reflection spectrums of said two sections to be approximately aligned at the first peak thereof, a length ratio of said two sections is adjusted so that said each laser element illuminates in an aligned reflection spectrum at a long wavelength mode or a short wavelength mode for forming a single-wavelength output, and then said sampling period of said each laser element in said laser array is formed to be different from one another for aligning said reflection spectrum of said each laser to different locations so that said each laser element outputs different wavelengths.

41. The laser array according to claim 39, wherein said grating of said each laser element is one of a loss coupled grating, a gain coupled grating, and a complex-coupled grating for generating a single-wavelength output, said specific thickness of said shift layer is formed so that said fixed difference of Bragg wavelengths of said two sections is approximately equal to said $\Delta P$ plus a fixed wavelength so as to cause said reflection spectrums of said two sections to be approximately aligned at the first peak thereof, and said two sections have an identical length thereof.

* * * * *